United States Patent

Jeng et al.

[11] Patent Number: 5,818,111
[45] Date of Patent: Oct. 6, 1998

[54] LOW CAPACITANCE INTERCONNECT STRUCTURES IN INTEGRATED CIRCUITS USING A STACK OF LOW DIELECTRIC MATERIALS

[75] Inventors: Shin-Puu Jeng; Kelly J. Taylor, both of Plano, Tex.

[73] Assignee: Texas Instruments Incorporated, Dallas, Tex.

[21] Appl. No.: 821,989

[22] Filed: Mar. 21, 1997

[51] Int. Cl.[6] .......................... H01L 23/48; H01L 29/52; H01L 29/40
[52] U.S. Cl. .......................... 257/776; 257/758; 257/775; 257/748; 438/631
[58] Field of Search .................................. 257/776, 775, 257/759, 750, 752, 748, 730, 758, 773; 438/631

[56] References Cited

U.S. PATENT DOCUMENTS

| | | | |
|---|---|---|---|
| 4,843,034 | 6/1989 | Hermdpm et al. | 437/189 |
| 4,851,362 | 7/1989 | Suzuki | 437/31 |
| 4,879,258 | 11/1989 | Fisher | 437/225 |

(List continued on next page.)

FOREIGN PATENT DOCUMENTS

| | | |
|---|---|---|
| 88-133920/20 | 11/1986 | European Pat. Off. . |
| 89-271922/38 | 3/1988 | European Pat. Off. . |
| 0411795A1 | 7/1990 | European Pat. Off. . |
| 0411795B1 | 7/1990 | European Pat. Off. . |
| 0420405A2 | 8/1990 | European Pat. Off. . |
| 0660409A1 | 12/1994 | European Pat. Off. . |
| 0333132A2 | 3/1989 | Germany . |
| H01L21/283 | 4/1989 | Germany . |
| 0476625A2 | 9/1991 | Germany . |
| 59-66171 | 4/1984 | Japan . |
| 60-143619 | 7/1985 | Japan . |
| 62-268144 | 11/1987 | Japan . |
| 63-179548 | 7/1988 | Japan . |
| 3-203240 | 3/1991 | Japan . |
| 5-267290 | 5/1993 | Japan . |

OTHER PUBLICATIONS

"Semiconductor Devices", Physics and Technology, p. 472, S.M. SZE.

V. Grewal, et al. "A Novel Multilevel Metallization Technique for Advanced CMOS and Bipolar Integrated Circuits", V–MIC Conf. Jun. 9–10, 1986 pp. 107–113.

(List continued on next page.)

Primary Examiner—Mahshid D. Saadat
Assistant Examiner—Jhihan B. Clark
Attorney, Agent, or Firm—Bret J. Petersen; James C. Kesterson; Richard L. Donaldson

[57] ABSTRACT

An improved method and structure is provided for integrating HSQ and other low dielectric constant materials, which may have undesirable properties, into integrated circuit structures and processes, especially those requiring multiple levels of interconnect lines. The present invention combines the advantages of $SiO_2$ and low dielectric constant materials by creating a multilayer dielectric stack of alternating layers of low-k materials and traditional dielectrics. A stabilizing layer is inserted between layers of low-k films. Since the thickness of problematic low-k materials remain less than the cracking threshold, many of the problems discussed above are alleviated. The stabilizing prevents the nucleation and propagation of micro cracks. In a preferred embodiment, interconnect lines 14 are first patterned and etched on a substrate 10. A low-k material such as hydrogen silsesquioxane (HSQ) 18 is spun across the surface of the wafer to fill areas between interconnect lines. The HSQ is then heated on a hot plate to cure. A thin dielectric stabilizing layer such as $SiO_2$ 20 can then be applied to on top of the low-k material. A thick $SiO_2$ planarization layer 22 may then be applied and planarized. In other embodiments, the HSQ and $SiO_2$ process steps can be repeated for multiple layers of HSQ.

19 Claims, 2 Drawing Sheets

U.S. PATENT DOCUMENTS

| | | | |
|---|---|---|---|
| 4,986,878 | 1/1991 | Malazgirt et al. | 156/643 |
| 5,073,814 | 12/1991 | Cole, Jr. et al. | 357/54 |
| 5,155,576 | 10/1992 | Mizushima | 357/71 |
| 5,231,043 | 7/1993 | Chan et al. | 437/52 |
| 5,233,224 | 8/1993 | Ikeda et al. | 257/773 |
| 5,302,233 | 4/1994 | Kim et al. | 156/636 |
| 5,310,700 | 5/1994 | Lien et al. | 437/195 |
| 5,336,368 | 8/1994 | Iacovangelo et al. | 156/656 |
| 5,352,493 | 10/1994 | Dorfman et al. | 427/530 |
| 5,356,513 | 10/1994 | Burke et al. | 156/636 |
| 5,366,850 | 11/1994 | Chen et al. | 430/314 |
| 5,376,591 | 12/1994 | Maeda et al. | 437/238 |
| 5,391,921 | 2/1995 | Kudoh et al. | 257/758 |
| 5,407,860 | 4/1995 | Stolz et al. | 437/180 |
| 5,413,962 | 5/1995 | Lur et al. | 437/195 |
| 5,461,003 | 10/1995 | Havemann et al. | 437/187 |
| 5,486,493 | 1/1996 | Jeng | 437/195 |
| 5,512,775 | 4/1996 | Cho | 257/522 |

OTHER PUBLICATIONS

Shin–Puu Jeng, et al. "A Planarized Multilevel Interconnect Scheme With Embedded Low–Dielectric–Constant Polymers for Sub–Quarter Micro Applications", *1994 Symposium on VLSI Technology Digest of Technical Papers*, pp. 73–74.

Joel R. Wiesner, "Gap Filling of Multilevel Metal Interconnectswith 0.25–um Geometries", Oct. 1993, *Solid State Technology*, pp. 63–64.

IBMTDB, *Multilevel Interconnect Structure*, vol. 34, No. 9, Feb. 1992, p. 220.

M.A. Hartney, et al. "Oxygen Plasma Etching for Resist Stripping and Multilayer Lithography", *J. Vac. Sci. Technol. B*. vol. 7, No. 1, Jan./Feb. 1989, pp. 1–11.

Gretchen M. Adema, et al. "*Passivation Schemes for Copper/Polymer Thin Film Interconnections Used in Multichip Modules*", *1992 IEEE*, pp. 776–782.

H. Satou et al. "Polyimides for Electronic Applications", 1993, *Polymers for Electronic and Photonic Applications*, pp. 221–2473

LOW CAPACITANCE INTERCONNECT STRUCTURES IN INTEGRATED CIRCUITS USING A STACK OF LOW DIELECTRIC MATERIALS

FIELD OF THE INVENTION

This invention generally relates to structures for reducing capacitance between closely spaced interconnect lines of integrated circuits. More particularly, it relates to a structure and method for preventing cracks in low dielectric constant materials used in combination with traditional intermetal dielectric materials having better structural properties.

BACKGROUND OF THE INVENTION

Integrated circuits have continued to shrink in size and increase in complexity with each new generation of devices. As a result, integrated circuits increasingly require very close spacing of interconnect lines and many now require multiple levels of metalization, as many as five, to interconnect the various circuits on the device. Since closer spacing increases capacitance between adjacent lines, as the device geometries shrink and densities increase capacitance and cross talk between adjacent lines becomes more of a problem. Therefore, it becomes increasingly more desirable to use lower dielectric materials to offset this trend and thereby lower capacitance between closely spaced interconnects.

Interconnect capacitance has two components: the line-to-substrate, or line-to-ground capacitance and line-line capacitance. For ultra large scale integration at 0.25 micron design rules and beyond, performance is dominated by interconnect RC delay, with line-to-line capacitance being the dominant contributor to total capacitance. For example, theoretical modeling has shown that when the width/spacing is scaled down below 0.3 micron, the interlayer capacitance is so small that total capacitance is dictated by the line-to-line capacitance, which constitutes more than 90% of the total interconnect capacitance. Therefore, a reduction of the line-line capacitance alone will provide a dramatic reduction in total capacitance.

The intermetal dielectric (IMD) of the prior art is typically $SiO_2$ which has a dielectric constant of about 4.0. It would be desirable to replace this material with a material having a lower dielectric constant. As used herein, low dielectric constant or low-k means a material having a dielectric constant of lower than about 3.5 and preferably lower than 3 and most preferably about 2 or lower. Unfortunately, materials having a lower dielectric constant have characteristics that make them difficult to integrate into existing integrated circuit structures and processes. Many polymeric materials such as polysilsesquioxane, parylene, polyimide, benzocyclobutene and amorphous Teflon have lower dielectric constants (lower permitivities). Other preferred materials are Aerogel or Xerogel which are typically made from a gelation of tetraethyl orthosilicate stock solution. Compared to $SiO_2$, these preferred low-k materials typically have low mechanical strength, poor dimensional stability, poor temperature stability, high moisture absorption and permeation, poor adhesion, large thermal expansion coefficient and an unstable stress level. Because of these attributes, the use of polymer or other low dielectric materials as a stand alone replacement for $SiO_2$ in integrated circuit processes or structures is very.

An earlier application, by Havemann, Ser. No. 08/250,142 assigned to Texas Instruments Inc. and incorporated herein by reference, disclosed a two-step metal etch process for selectively filling the gaps of narrowly spaced interconnects to reduce capacitance in VLSI circuits while using a structurally sturdy interlevel dielectric in non-critical areas. The disadvantages of this method include two separate metal etches and two separate interlevel dielectric depositions.

Another application by applicant herein, Ser. No. 08/202,057, assigned to Texas Instruments Inc. and incorporated herein by reference, disclosed a method for filling narrow gaps with low dielectric constant materials.

SUMMARY OF THE INVENTION

The present invention provides an improved method and structure for integrating low dielectric constant materials, which may have undesirable properties such as those discussed above, into integrated circuit structures and processes, especially those requiring multiple levels of interconnect lines. The present invention is particularly concerned with improving the mechanical strength and crack resistance of low-k films such as porous silicate Aerogel and porous hydrogen silsesquioxane (HSQ).

The mechanical strength of porous, low-k films such as silicate xerogel and HSQ is much lower than that of standard plasma $SiO_2$ or $Si_3N_4$. Thus, thick films of such materials can easily crack creating reliability limits for these types of materials. It has been determined that the thickness of HSQ not exceed 7,000 Å on blanket and 5,000 Å on a topologous wafer. Similarly, the allowable thickness of aerogel film is also limited due to its susceptibility to cracking.

The present invention solves the cracking problem by placing a stabilizing layer in between layers of problematic low-k materials, thereby combining the advantages of traditional dielectrics and low dielectric constant materials. An intermetal dielectric layer of the prior art, typically about one micron thick, is replaced with a stack of alternating low-k layers and stabilizing layers of traditional dielectrics. Since the thickness of problematic low-k materials remain less than the cracking threshold, many of the problems discussed above are alleviated. Structural stability, adhesion, thermal conductivity etc. are enhanced by the stabilizing layer, creating a more reliable and lower capacitance intermetal dielectric. The stabilizing layer may be dense plasma $SiO_2$, plasma $Si_3N_4$ or other suitable dielectric. In addition, the thickness of the stabilizing can be optimized according to the strength and thickness of the low-k film, and the capacitance of the composite stack. The stabilizing layer prevents the nucleation and propagation of micro cracks.

In a preferred embodiment, interconnect lines are first patterned and etched. A low-k material such as hydrogen silsesquioxane (HSQ) is spun across the surface of the wafer to fill areas between interconnect lines. The HSQ is then heated on a hot plate to cure. A thin dielectric stabilizing layer such as $SiO_2$ can then be applied to on top of the low-k material. A thick $SiO_2$ planarization layer may then be applied and planarized. In other embodiments, the HSQ and $SiO_2$ process steps can be repeated for multiple layers of HSQ.

An advantage of the present invention is a reduction in line-to-line and line-ground capacitance by using low-k materials and improved reliability and producibility from the reduction in cracking in these low-k materials. Another advantage for an embodiment of this invention is the low-k material such as polymers can be used with traditional intermetal dielectrics without failure of the bonding between those intermetal dielectrics and the low-k polymer materials.

An additional advantage of this invention is standard metal etching processes can be used and precise etching techniques may not be needed. Also, the present invention may be combined with the methods of the above referenced applications.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows read in conjunction with the accompanying drawings, wherein:

DETAILED DESCRIPTION OF THE PREFERRED EMBODIMENTS

The preferred embodiments of the present invention are best understood by referring to FIGS. 1–6 of the drawings, like numerals are used for like and corresponding parts of the various drawings.

Figure 1:
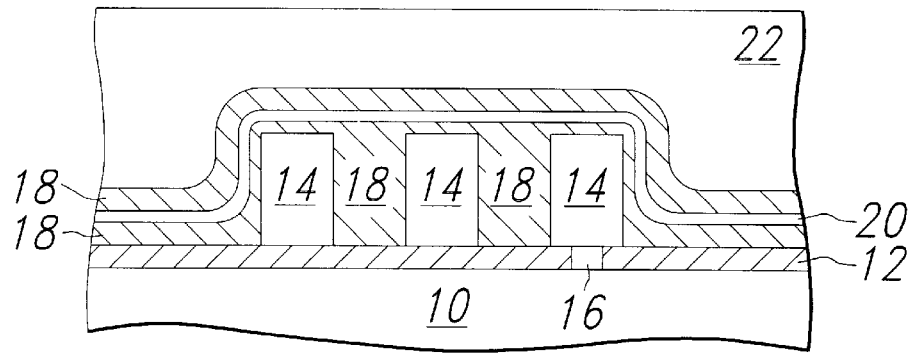
FIG. 1 Represents a cross-sectional view of a preferred embodiment of the present invention.

With reference to FIG. 1, there is shown an embodiment of the present invention, wherein a low-k material 18 is deposited between interconnect lines 14 on a semiconductor substrate 10. The low-k material may be applied by one of several methods known in the art and by those listed in the above referenced applications. A thin dielectric layer or stabilizing layer 20 covers the low-k material. The stabilizing layer may then be followed by an additional low-k material layer. The intermetal region may then be completed with a planarized intermetal dielectric layer 22.

Figure 2A:
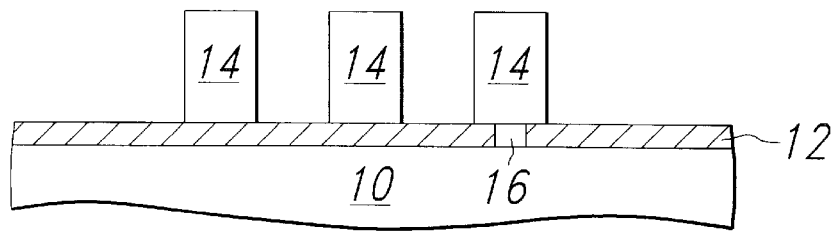
FIG. 2a–b Shows the steps to fabricate the preferred embodiment of FIG. 1.
Figure 2B:
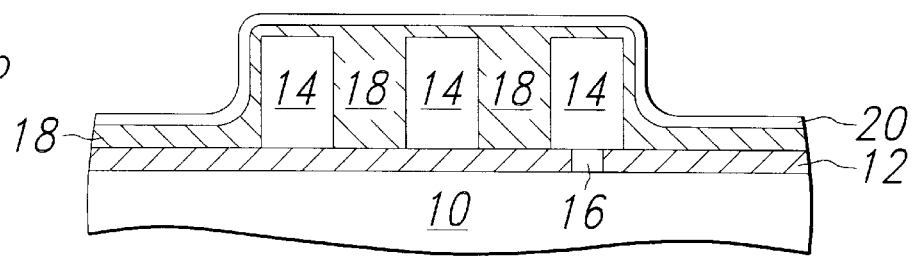

With reference to FIGS. 2a–2b, there is shown a sequence of steps for forming an embodiment of the present invention which is represented by the completed structure shown in FIG. 1. FIG. 2a illustrates a semiconductor substrate 10 covered with a layer of dielectric 12. The illustrated embodiment of the present invention is directed to reducing capacitance between interconnections on an integrated circuit. Since these interconnections are typically located over the top of active devices fabricated on the surface of a wafer of semiconducting material such as silicon crystal, semiconductor substrate 10 will normally include several layers of various semiconductor materials which make up the active components of the semiconductor device. For simplicity, these layers and devices are not shown in the illustrations. Dielectric layer 12 may be any material suitable for insulating metal interconnect lines 14 from components or other materials in layers below and shown lumped together as semiconductor substrate 10.

Interconnect lines are preferably formed by depositing a layer of aluminum on a preferably planer dielectric layer 12. The aluminum may be masked with a resist, patterned and etched with one of several methods known in the art. This procedure results in the metal connecting lines 14 as shown in FIG. 2a. The method of the present invention contemplates using high aspect ratio metal, where the thickness of the interconnect metal is greater than the width. The high aspect ratio interconnects are useful to reduce line resistance while maintaining close spacing for high density circuits. Connection between the interconnects and the circuits below is represented by the via and plug 16. The number and location of vias is determined by the underlying circuit design.

FIG. 2b shows the application of a low dielectric constant material 18 applied between the interconnects 14 on the surface of the wafer. The low-k material 18 is applied in sufficient thickness to fill critical areas between the metal interconnects 14, shown in FIG. 2b. The preferred materials are those listed in the table below, which have a dielectric constant of less than about 3, while the most preferred is hydrogen silsesquioxane (HSQ).

The low-k material 18 is followed by a stabilizing layer 20 as shown in FIG. 2b. The stabilizing layer helps prevent the nucleation and propagation of micro cracks. The thickness of the stabilizing can be optimized according to the strength and thickness of the low-k film, and the capacitance of the composite stack. The stabilizing layer may be dense plasma $SiO_2$, plasma $Si_3N_4$ or other suitable dielectric. For silicate low-k dielectrics, a chemical vapor deposited $SiO_2$ stabilizing layer is preferred because it uses the same CF based chemistry for etching as is used for via etch. The thickness of the stabilizing layer is preferably about 100–3,000 Å, and most preferably about 500 Å.

In a preferred embodiment, the stabilizing layer is followed with a second layer of low-k material as shown in FIG. 2c. The last low-k material layer 20 may then be followed by a thick, about 16,000 Å, $SiO_2$ interlayer dielectric 22 for planarization. After planarization of the interlayer dielectric, the structure is as shown in FIG. 1. In a preferred embodiment, the interlayer dielectric is $SiO_2$ deposited by plasma enhanced chemical vapor deposition (PECVD) and planarized by chemical mechanical polishing (CMP). As further discussed below, the present invention combines the advantages of $SiO_2$ and low dielectric constant materials by placing the low dielectric material between traditional dielectric materials. Structural stability, adhesion, thermal conductivity etc. are enhanced by the $SiO_2$ or other suitable dielectric.

Figure 3:
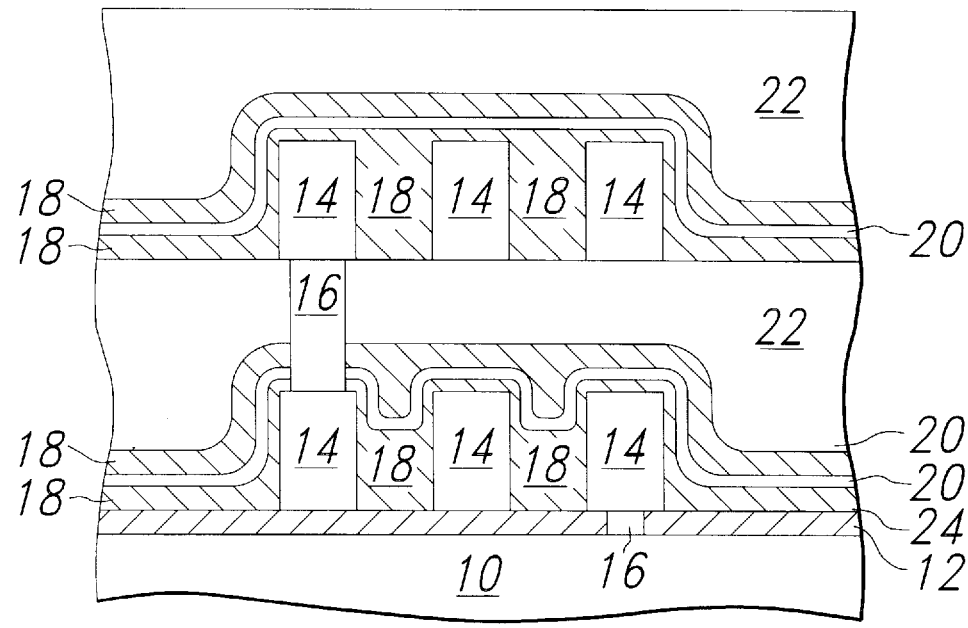
FIG. 3 Represents a cross-sectional view of a preferred embodiment of the present invention having multiple levels of interconnect lines.

The method of the present invention may be repeated to form multiple levels of interconnects stacked one upon the other. An example of multiple levels is shown in FIG. 3. Typically multiple level interconnects will necessitate vias 16 and contacts from one level to the next. These vias are usually made after the interlevel dielectric has been applied and planarized in a manner well known in the art.

Figure 4:
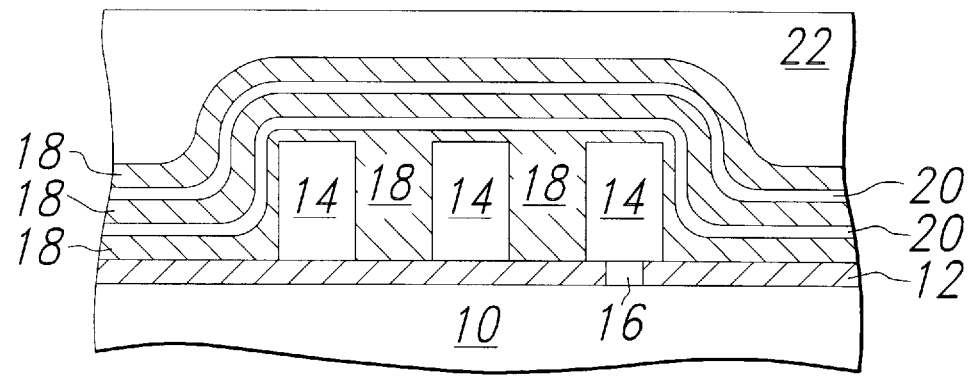
FIG. 4 Represents a cross-sectional view of another preferred embodiment of the present invention.

In another preferred embodiment, the second layer of low-k material is followed with a second stabilizing layer as shown in FIG. 1. The second stabilizing layer may then be followed with a third low-k material layer as shown. Similarly, the last low-k material layer 20 may then be followed by a thick, about 16,000 Å, $SiO_2$ interlayer dielectric 22 for planarization. After planarization of the interlayer dielectric, the structure is as shown in FIG. 4. In other embodiments, any number of alternating layers of low-k material and stabilizing layers may be used.

The present invention also contemplates using a stabilizing layer in combination with the structures and techniques disclosed in the previous co-assigned applications listed above.

In the preferred embodiments, the low-k material is applied by the spin-on method. In the spin-on method the low-k material is dropped in a liquid form onto the spinning wafer (substrate) and the material disperses across the wafer. The methods of Se. No. 60/005132 (TI-20784) may be used to place the low-k polymer material between closely spaced interconnects in critical areas. Spin-on application typically results in the material being deposited with a varying thickness across the wafer. The thickness of the material usually will be thicker in areas where the width of the gap is narrow. The gap fill is affected by several characteristics including the degree of wetting of the liquid on the wafer and top layers, the volume and aspect ratio of the gap, the viscosity of the liquid, the spin speed, and the nominal thickness of the liquid on the field or widely spaced areas. For a minimum interconnect spacing in a preferred embodiment, a combination of the above parameters is chosen to result in full coverage of the area between interconnects that use the minimum spacing.

Figure 5:
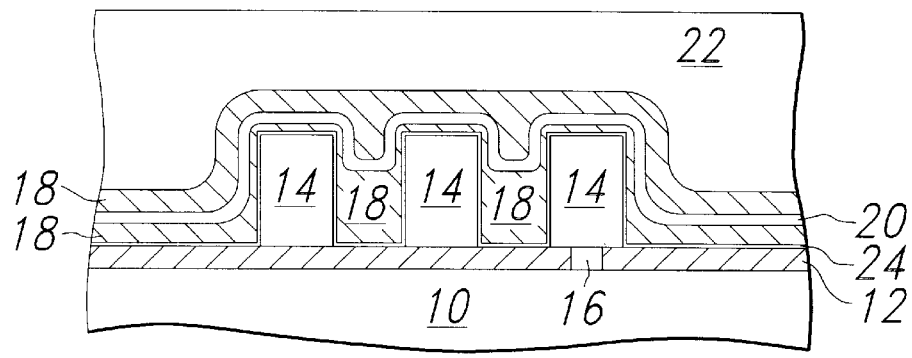
FIG. 5 Represents a cross-sectional view of another preferred embodiment of the present invention where the stabilizing layer extends below the top level of the interconnect lines.

Another embodiment is illustrated in FIG. 5. In this embodiment the first layer of low-k material 18 does not completely fill the area between the interconnect lines. The stabilizing layer 20 is applied before a second layer of low-k material, completely filling the area between the interconnects. The advantage of such a structure is thin stabilizing layers to keep the thickness of the low-k material below a critical thickness while filling a substantial portion of the area between the interconnects with a low dielectric constant material. Similarly, any number of layers of low-k materials could be used with alternating stabilizing layers.

FIG. 5 also shows a liner layer 24. The use of a liner layer 24 is optional depending upon whether the low-k dielectric can be directly applied on the interconnects 14. The liner layer may be an etch stopping or protective overcoat layer such as CVD silicon oxide. A low-k material is then spun onto the surface of the wafer over the liner layer.

Figure 6:
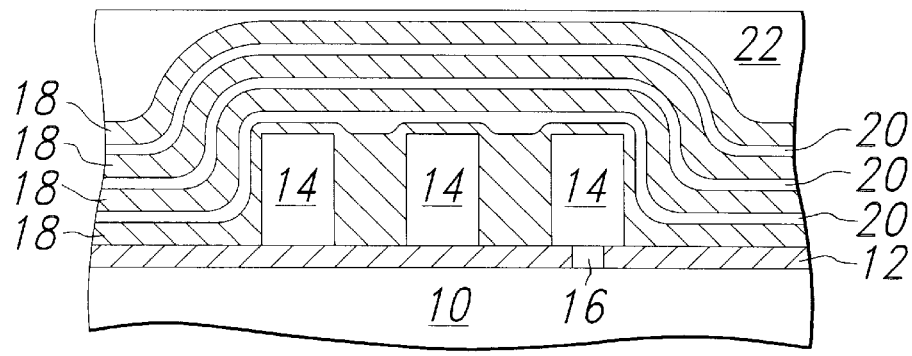
FIG. 6 Represents a cross-sectional view of another preferred embodiment of the present invention having three stabilizing layers.

An additional embodiment is illustrated in FIG. 6. This embodiment includes an additional stabilizing layer to illustrate that a number of stabilizing layers alternating with low-k material layers could be used.

The sole Table, below, provides an overview of some embodiments and the drawings.

TABLE

| Drawing Element | Preferred or Specific Examples | Generic Term | Other Alternative Examples |
|---|---|---|---|
| 10 | Silicon Substrate | Substrate or Wafer | GaAs |
| 12 | Silicon Oxide | Buffer Layer | |
| 14 | Aluminum | Interconnect Line | TiN/Al/TiN, Cu, W |
| 16 | Tungsten | Via | Aluminum |
| 18 | HSQ | Low Dielectric Constant Material | Aerogel, Xerogel, organic spin-on glass, spin-on polymers |
| 20 | TEOS | Stabilizing Layer | Fluorinated $SiO_2$, $Si_3N_4$, Diamond, or other dielectrics with good mechanical strength. |
| 22 | $SiO_2$ | Inter-metal Dielectric | Fluorinated $SiO_2$, $Si_3N_4$, Diamond, or other dielectrics with good mechanical strength. |
| 24 | Silicon Oxide | Liner | Fluorinated $SiO_2$ |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A microelectronic device structure comprising:
    (a) a substrate;
    (b) a plurality of closely spaced interconnect lines formed on said substrate;
    (c) a first low-dielectric material layer between at least some of said closely spaced interconnect lines at a thickness less than the thickness of said interconnect lines, said low-dielectric material layer having greater susceptibility to cracking than conventional spin on glass and providing a dielectric constant of less than 3.5 in a region between at least two of said interconnect lines; and
    (d) a first stabilizing layer formed of a second low-dielectric material over said first low dielectric constant material layer between said closely-spaced interconnect lines.

2. The structure according to claim 1, further comprising:
    (e) a second low-dielectric material layer on said stabilizing layer; and
    (f) a second stabilizing layer on said second low-dielectric material layer.

3. The structure according to claim 1, wherein said first low-dielectric constant material layer is a porous silicate gel and said second low dielectric constant material layer is HSQ.

4. The microelectronic structure of claim 2, further comprising a structural dielectric material layer formed over said second stabilizing layer.

5. The microelectronic structure of claim 2, wherein said second stabilizing layer is a structural layer which is planarized and further comprising one or more additional levels of interconnect lines above said interconnect lines.

6. The microelectronic structure of claim 1, wherein said first stabilizing layer material is 100–1,000 Å thick and selected from the group consisting of: silicon dioxide, fluorinated $SiO_2$, $Si_3N_4$, and diamond.

7. The structure according to claim 2, further comprising;
    (g) a third low-dielectric material layer on said second stabilizing layer; and
    (h) a third stabilizing layer on said third low-dielectric material layer.

8. A microelectronic device structure comprising:
    (a) a semiconductor substrate;
    (b) a plurality of closely spaced interconnect lines formed on said substrate;
    (c) a first low-dielectric material layer between at least some of said closely-spaced interconnect lines, said low-dielectric material having greater susceptibility to cracking than conventional spin on glass and providing a dielectric constant of less than 3 in a region between at least two of said interconnect lines; and
    (d) a thin stabilizing layer formed of a second low-dielectric material over said low dielectric constant material layer between said closely-spaced interconnect lines and over said substrate in areas not having metal interconnect lines.

9. The structure according to claim 8, further comprising a second low dielectric constant material layer on said thin stabilizing layer, and wherein a structural interlayer dielectric layer is formed above said second low dielectric constant material layer.

10. The microelectronic structure of claim 9, wherein said structural interlayer dielectric liner layer is planarized $SiO_2$.

11. The microelectronic structure of claim 9, also comprising a liner layer over said conductive interconnect lines and below said first low dielectric constant material layer.

12. The microelectronic structure of claim 9, wherein said stabilizing layer material is 100–1,000 Å thick and selected from the group consisting of: silicon dioxide, fluorinated $SiO_2$, $Si_3N_4$, and diamond.

13. A microelectronic device structure comprising:
   (a) a semiconductor substrate;
   (b) a plurality of closely spaced interconnect lines formed on said substrate;
   (c) a first low-dielectric material layer between at least some of said closely spaced interconnect lines, said low-dielectric material providing a dielectric constant of less than 3.5 in a region between at least two of said interconnect lines; and
   (d) a thin stabilizing layer formed of a second low-dielectric material over said first low dielectric constant material layer between said closely-spaced interconnect lines and over said substrate in areas not having metal interconnect lines and those closely spaced interconnect lines not having low-dielectric material between them, wherein said stabilizing layer material is 100–1,000 Å thick and selected from the group consisting of: silicon dioxide, fluorinated $SiO_2$, $Si_3N_4$, and diamond.

14. The structure according to claim 13, further comprising:
   (e) a second low-dielectric material layer on said stabilizing layer; and
   (f) a second stabilizing layer on said second low-dielectric material layer.

15. The structure according to claim 13, wherein said first low-dielectric constant material layer is a porous silicate gel and said second low dielectric constant material layer is HSQ.

16. The structure according to claim 13, wherein said first low-dielectric constant material layer and said second low dielectric constant material layer is HSQ.

17. The microelectronic structure of claim 13, further comprising a structural dielectric material of $SiO_2$ formed above said second stabilizing layer.

18. The microelectronic structure of claim 13, wherein said structural layer is planarized and further comprising one or more additional levels of interconnect lines above said interconnect lines.

19. The structure according to claim 14, further comprising:
   (g) a third low-dielectric material layer on said second stabilizing layer; and
   (h) a third stabilizing layer on said third low-dielectric material layer.

* * * * *